United States Patent [19]

Sutton et al.

[11] Patent Number: 5,423,044

[45] Date of Patent: Jun. 6, 1995

[54] SHARED, DISTRIBUTED LOCK MANAGER FOR LOOSELY COUPLED PROCESSING SYSTEMS

[75] Inventors: Peter G. Sutton, Yorktown Heights, N.Y.; Ian J. Kupfer, Chesterfield, Mo.; Glenn W. Sears, Jr., Ulster Park; Theodore Goetz, Katonah, both of N.Y.; Robert O. Dryfoos, Ridgefield, Conn.

[73] Assignee: International Business Machines Corporation, Armonk, N.Y.

[21] Appl. No.: 899,664

[22] Filed: Jun. 16, 1992

[51] Int. Cl.⁶ .............. G06F 13/16; G06F 13/364; G06F 12/16; G06F 9/46

[52] U.S. Cl. .................. 395/725; 395/425; 395/650; 364/228.1; 364/230; 364/230.4; 364/246.6; 364/246.8; 364/DIG. 1

[58] Field of Search .............. 395/725, 325, 425, 575, 395/650; 370/85.4; 340/825.06

[56] References Cited

U.S. PATENT DOCUMENTS

| | | | |
|---|---|---|---|
| 4,419,724 | 12/1983 | Branigin et al. | 395/325 |
| 4,480,304 | 10/1984 | Carr et al. | 364/200 |
| 4,574,350 | 3/1986 | Starr | 395/725 |
| 4,587,609 | 5/1986 | Boudreau et al. | 395/725 |
| 4,654,784 | 3/1987 | Campanini | 364/200 |
| 4,716,528 | 12/1987 | Crus et al. | 364/300 |
| 4,733,352 | 3/1988 | Nakamura et al. | 364/200 |
| 4,965,719 | 10/1990 | Shoens et al. | 395/650 |
| 4,984,153 | 1/1991 | Kregness et al. | 364/200 |
| 5,060,144 | 10/1991 | Sipple et al. | 364/200 |
| 5,062,038 | 10/1991 | Jordan, Jr. | 364/200 |
| 5,129,089 | 7/1992 | Nielsen | 395/725 |
| 5,140,685 | 8/1992 | Sipple et al. | 395/425 |
| 5,161,227 | 11/1992 | Dias et al. | 395/650 |
| 5,175,837 | 12/1992 | Arnold et al. | 395/425 |
| 5,202,971 | 4/1993 | Henson et al. | 395/425 |
| 5,226,143 | 7/1993 | Baird et al. | 395/425 |
| 5,226,159 | 7/1993 | Henson et al. | 395/650 |
| 5,263,146 | 11/1993 | Mishima | 395/425 |
| 5,274,824 | 12/1993 | Howarth | 395/725 |
| 5,285,528 | 2/1994 | Hart | 395/725 |
| 5,297,262 | 3/1994 | Cox et al. | 395/325 |
| 5,307,483 | 4/1994 | Knipfer et al. | 395/575 |

OTHER PUBLICATIONS

IBM Tech. Disclosure Bulletin, vol. 25, No. 7B, Dec. 1982.
IBM Tech. Disclosure Bulletin, vol. 34, No. 2, Jul. 1991.

*Primary Examiner*—Gopal C. Ray
*Attorney, Agent, or Firm*—William A. Kinnaman, Jr.; Mark S. Walker

[57] ABSTRACT

Apparatus and process for managing shared, distributed locks in a multiprocessing complex. The manager operates using a partitionable lock space with logical processor connection. Logically connected processors are subject to validation and disconnection due to failure. The locks synchronize data access to identifiable subunits of DASD. Denied lock requests are queued for servicing when the lock becomes available. Lock partitions are used to speed DASD to DASD copying without halting processing on the first DASD. A special partition is assigned to the copy task and the processors writing to the DASD can determine copy status with a single read or test. Operations requiring multilateral agreement of processors, such as rebuilding locks or moving locks, are protected by fencing any nonresponsive processor. A special queue partition is designated for master/slave control point designation. All processors contend for the master lock and losing contenders are queue. Queuing provides automatic fallback in case of a failing processor.

24 Claims, 9 Drawing Sheets

SHARED, DISTRIBUTED LOCK MANAGER FOR LOOSELY COUPLED PROCESSING SYSTEMS

BACKGROUND OF THE INVENTION

1. Field of the Invention

The present invention relates generally to computer apparatus and methods for synchronizing storage access. Hope particularly, the invention relates to apparatus and methods for allowing loosely coupled processors to synchronize access to direct access storage devices shared by the complex through the use of a distributed lock manager.

2. Background and Related Art

Computer systems are constructed from a number of components. A typical system will include at least one processor, an amount of random access memory (RAM), input/output devices such as a display, keyboard, and printer, and permanent storage devices such as disk drives and tape drives. The size of a problem that can be handled by a particular computer system is determined by the relative size of the system components.

Certain problems, such as mathematical modelling problems, require large amounts of processing power. Others, such as printing of monthly customer bills, may require large permanent storage and input/output capacities. Systems of the necessary size and power may be constructed by combining the necessary components. Multiprocessing systems are created by combining several processors (often referenced as "CPUs") with the necessary RAM, input/output devices and permanent storage.

Figure 1:
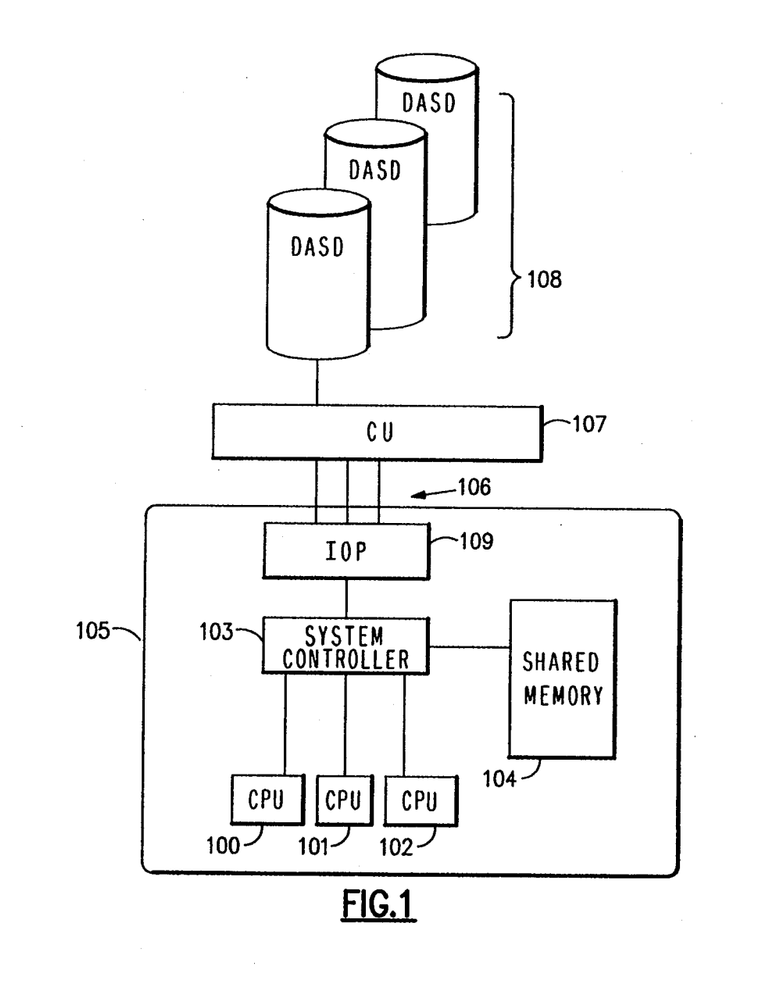
FIG. 1 is a block diagram illustrating the structure of a tightly coupled multiprocessor.

Multiprocessors are typically coupled using one of three interconnection schemes: tightly coupled; loosely coupled; and not coupled, but communicating. A tightly coupled interconnection architecture is one in which several processing units share random access memory and input/output subsystems forming, in effect, a single processor. A typical tightly coupled processor is shown in FIG. 1. Processing units or CPUs 100, 101 and 102 are connected to a system controller 103 which in turn is connected to a shared memory 104 and input/output processor (IOP) 109. The input/output processor 109 is connected to input/output channels 106 which are connected, in turn, to direct access storage device (DASD) control units (CUs) 107 and finally to the direct access storage devices (DASD) 108.

The tightly coupled interconnection architecture allows multiple CPUs to be assembled in a single processor sharing a single memory and input/output subsystem. Access is typically controlled by the operating system using locks in shared memory 104. This architecture, however, cannot support large numbers of processors in a highly parallel or massively parallel configuration due to the complexities of processor interconnection logic.

Figure 2:
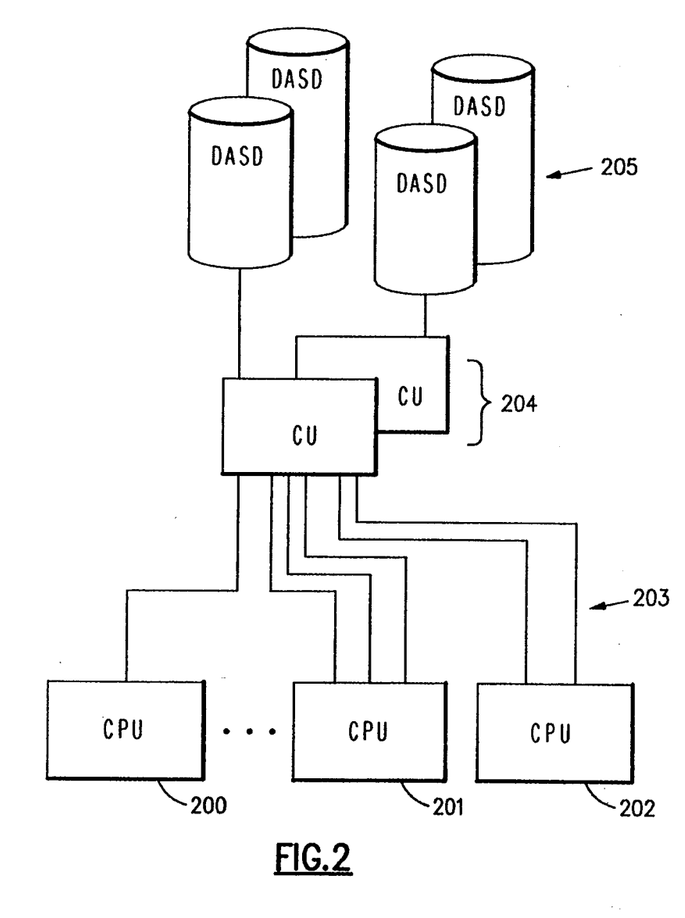
FIG. 2 is a block diagram illustrating the structure of a loosely coupled shared data multiprocessing complex.

Loosely coupled shared DASD systems are shown by example in FIG. 2. The processors 200, 201 and 202 are either single processors or tightly coupled multiprocessors as described above. Channels 203 from each processor connect to DASD control units 204 providing at least one link from each processor to each DASD control unit. DASD 205 are connected to the DASD control units 204 and are accessible by each of the processors. Communication links (not shown) are provided between the processors to enable interprocessor communication.

The third interconnection scheme relies solely upon interprocessor communication and provides no shared resources.

Figure 3:
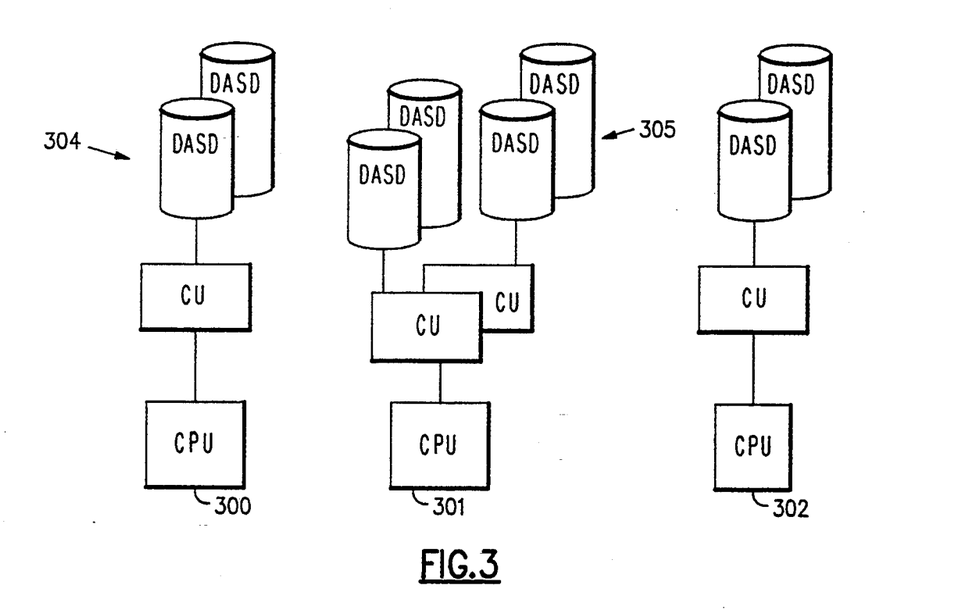
FIG. 3 is a block diagram illustrating the structure of a multiprocessing system with no shared resources.

This architecture is shown in FIG. 5. Each processor has its own private random access memory, permanent data storage and input/output systems. Each processor 388, 381 and 382 is either a single processor or tightly coupled CPU complex. DASD control units 383 are connected to only one of the processors so that DASD, e.g. 304 are connected to only one processor (in this case processor 300.) Communication between processors occurs only over communication links (not shown) rather than by shared data on DASD or in memory.

The present invention is directed at improving the synchronization of accesses to shared DASD in a loosely coupled processing system. Access must be controlled so that multiple processors do not attempt to access the same data simultaneously leading to corruption of the data. Resource synchronization is typically handled through the use of "locks." Resource locks can be defined that allow at most one processor to access a resource. In a tightly coupled system such locks are usually defined as designated shared memory locations. A loosely coupled system does not have shared memory and therefore must employ a different mechanism.

Past solutions to this problem have been to use interprocessor messages to communicate a request for access among the sharing processors. This has the disadvantage of relying on processor receipt and interpretation of the messages, something that may not occur in a timely manner.

A second solution has been to define a lock in the DASD mechanism itself. This solution has been implemented in the IBM Transaction Processing Facility (TPF) Operating System Product Version 3.1 as the "Limited Lock Facility." The limited lock facility uses a portion of the random access memory of the DASD control unit to maintain a set of locks for accessing each DASD unit. The control unit has a plurality of channel ports to which processors may be attached. Each channel port may hold one or more locks on one or more portions of a particular DASD as a proxy for the processor connected to that channel. The locks are managed based on the physical connection of the channel to the channel port.

The use of resource locks creates a special problem in a loosely coupled environment where a single processor may fail while holding a lock thereby tying up that resource. Another problem with shared DASD is created by an "erratic" processor that does not respond to system messages or to system protocols. By failing to follow conventions an "erratic" processor may destroy the data integrity of the DASD. These lock problems create the need for a mechanism to isolate or fence out an erratic or non-responsive processor.

Figure 5A:
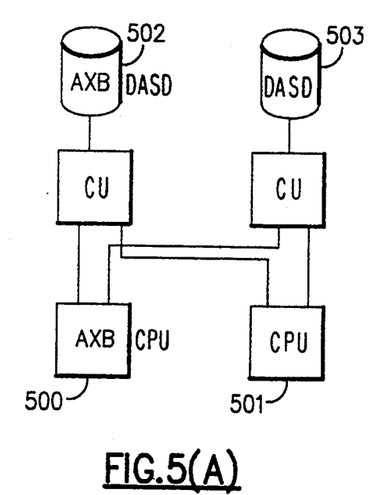
FIG. 5(A)-5(C) illustrate the changing state of data in a prior art DASD.
Figure 5B:
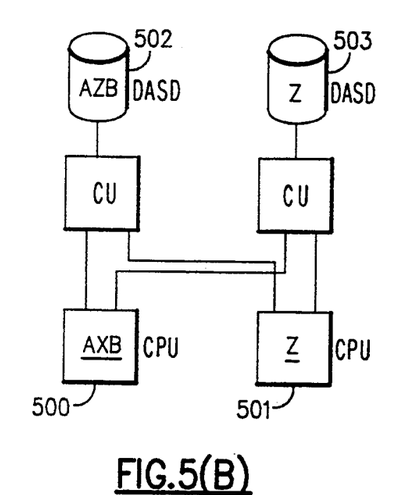
Figure 5C:
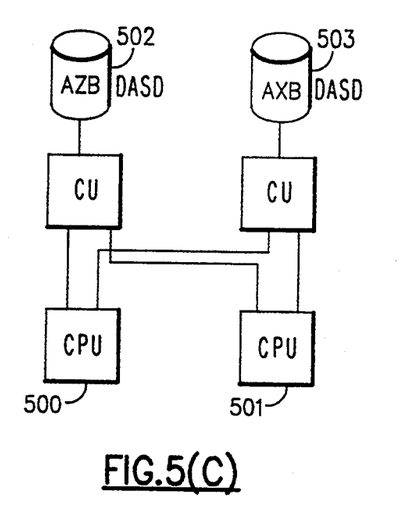

Yet another set of problems are created by the need to copy data from one DASD unit to another without disconnecting either DASD from the active systems. Copying of data and the associated locks requires synchronization of copying as well as writing to the DASD units. The problems that can arise while copying data from one DASD unit to another without disabling data update are illustrated with reference to FIG. 5. Processor 500 is creating a duplicate of DASD 502 on DASD 503. In FIG. 5(A) processor 500 has read a track containing data AXB from DASD 502 and will write that track to DASD 503. In the meantime, processor 501 writes data item Z to the track being copied from DASD 502. Knowing that DASD replication is in process, processor 501 also writes data Z to DASD 503. When processor 500 completes its copy step, it writes track data AXB to DASD 503 destroying data previously written by processor 501.

A related problem is the need to recreate lock records for a failed DASD unit. The complete failure of a DASD unit or partial failure requiring regeneration of the lock space requires coordination among the sharing processors to recreate the locks. Each processor knows which locks it holds in a given lock space. The processors can be queried and the resulting data used to regenerate the lock space. The failure of a processor or simply the loss of a message may corrupt the entire activity. The rebuild of the lock space requires data from all processors. If one is missing, the lock data will be incomplete and lock management activities cannot continue, In such a case the entire system may have to be restarted. High availability systems require that lock rebuilding be reliable and be able to occur even where one or more processors fails or is non-responsive.

These and other problems are addressed by the apparatus and methods of the present invention.

SUMMARY OF THE INVENTION

The present invention is directed to providing an improved lock management facility for loosely coupled shared DASD systems. The present invention provides an improved logical lock facility that restricts access to identified portions of controlled devices. The logical locks are established based on a verified connection token that must be present in any request to access or manipulate the locks. Failing or non-responsive processors may have their tokens revoked by another processor in the complex, Logical locks according to the present invention are partitionable allowing designation of specific locks for certain purposes, Among the purposes is to coordinate copying of data from one DASD unit to another and the ability to arbitrate master processor designation using a shared lock.

The present invention addresses the technical problem of effectively managing shared resources through the use of resource locks.

DETAILED DESCRIPTION

Figure 4:
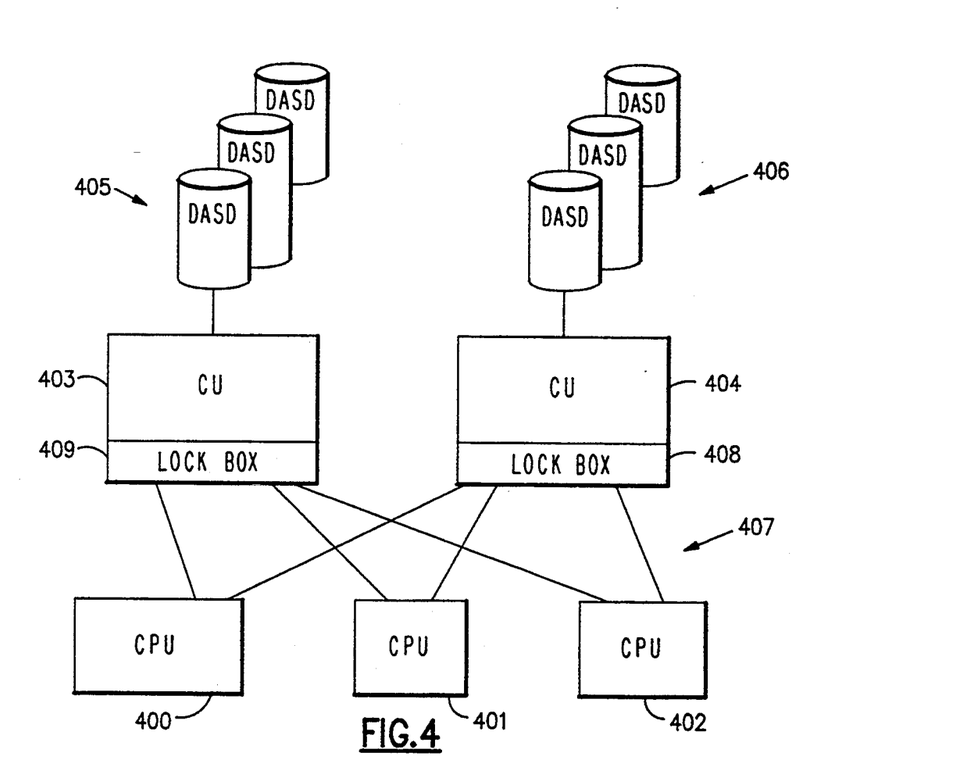
FIG. 4 is a block diagram illustrating the loosely coupled system with shared distributed locks of the present invention.

The present invention implements a shared, distributed lock mechanism in a loosely coupled processing environment. The preferred embodiment of the present invention can be configured as shown in FIG. 4. A plurality of processors 400, 401 and 402 (which can be individual processors or tightly coupled processors) are each connected to DASD control units 403 and 404 via channels 407. The connections link the processors to DASD control unit lock boxes 409 408 that control access to the DASD units 405 406. The control units can be of any known type, such as the IBM 3990 DASD Control Unit.

Lock boxes 408 409 each contain partitionable lock storage areas (not shown.) The lock boxes can contain a single lock or several special purpose locks. In addition, each of the lock boxes contains processing logic to manage the partitioned locks using a logical locking scheme. The physical structure and operation of the lock boxes is described in greater detail in IBM Technical Disclosure Bulletin Vol. 25, No. 7B pages 3762-3764 (12/82).

DESCRIPTION OF PROCESS

The locking facility of the present invention uses explicit "connect" and "disconnect" commands to establish a logical connection between a processor and a particular lock. Logical connections enable the fencing and master control determination features discussed below, Each lock box e.g. 408 is partitionable into logical lock spaces enabling designation of specific lock spaces for special purposes such as DASD copying. The use of partitions speeds lock access by eliminating the need to scan irrelevant lock records.

A request queue is provided within the lock box to maintain a queue of requested lock transitions to be granted as conflicting states are released. The lock box notifies the requesting processor whenever a queued lock has been granted.

The locking facility of the present invention operates asynchronously enabling use of high speed fiber optic links allowing DASD control units with the lock box to be placed up to several kilometers from the processors to which it is attached.

Figure 6:
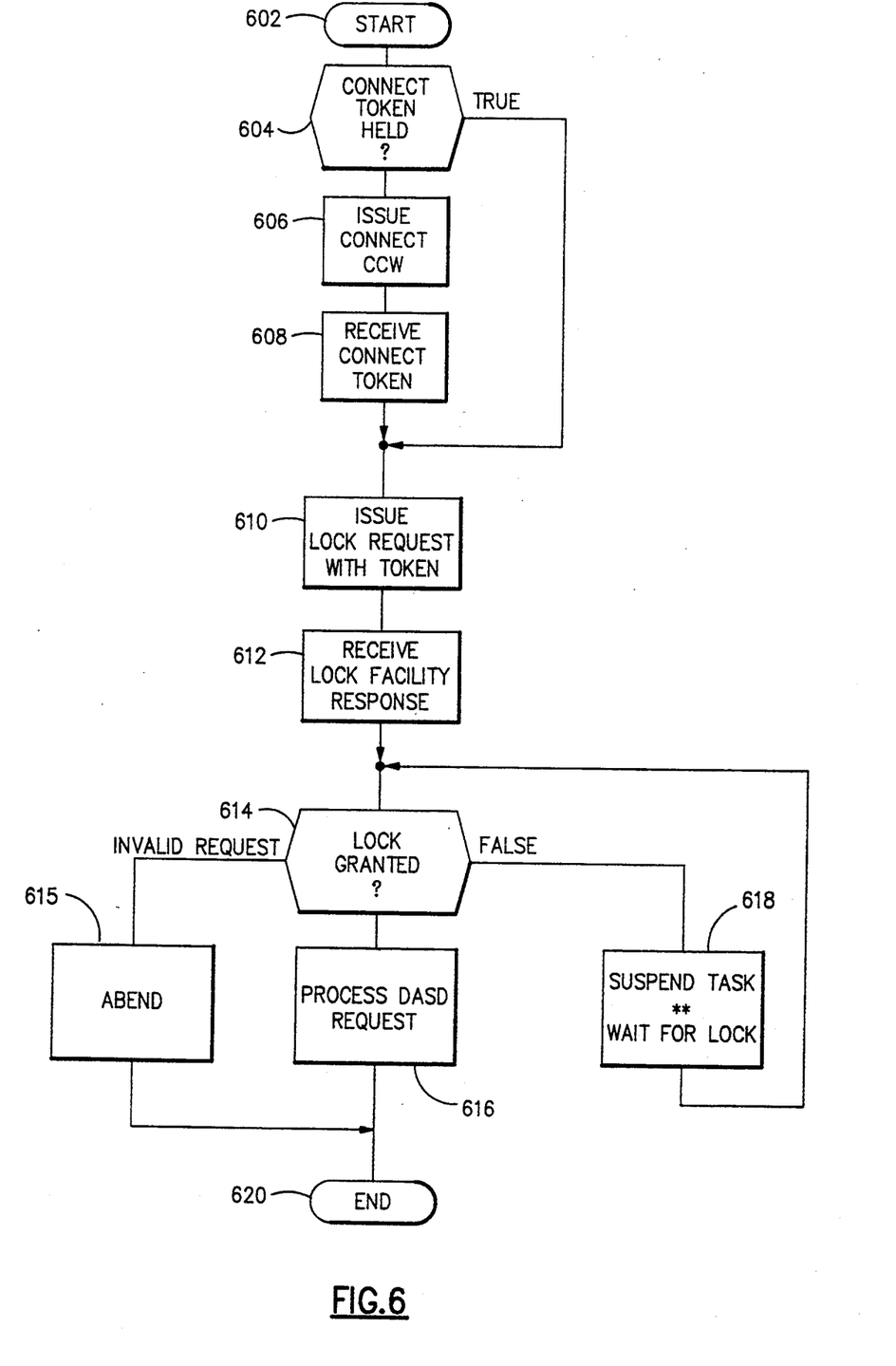
FIG. 6 is a flowchart describing the lock request process according to the present invention.

A lock is granted to a requesting process according to the following logic (refer to FIG. 6.) A processor, e.g. processor 400 in FIG. 4, requests a lock, step 602, on certain blocks in DASD 405. The processor first determines whether it holds a connect token for that DASD device, step 604. If not, a connect CCW command is issued 606 and the processor waits for a returned connect token 608. The lock request is generated containing the connect token 610 and sent over a first channel 407 to lock box 409. The processor receives the lock facility response 612 and tests for successful granting of the lock 614. If the lock has been granted processing of DASD operations proceeds 616. A control unit response that the request is invalid indicates that the requesting processor has been fenced from the control unit and probably needs to terminate 615 to diagnose the problem. Finally, the control unit may queue the request and not grant the lock. In that case the processor suspends work on the requesting task until notified by the control unit that the lock has been granted 618. Once granted, processing may continue to the end 620.

Figures 7, 8, 12:
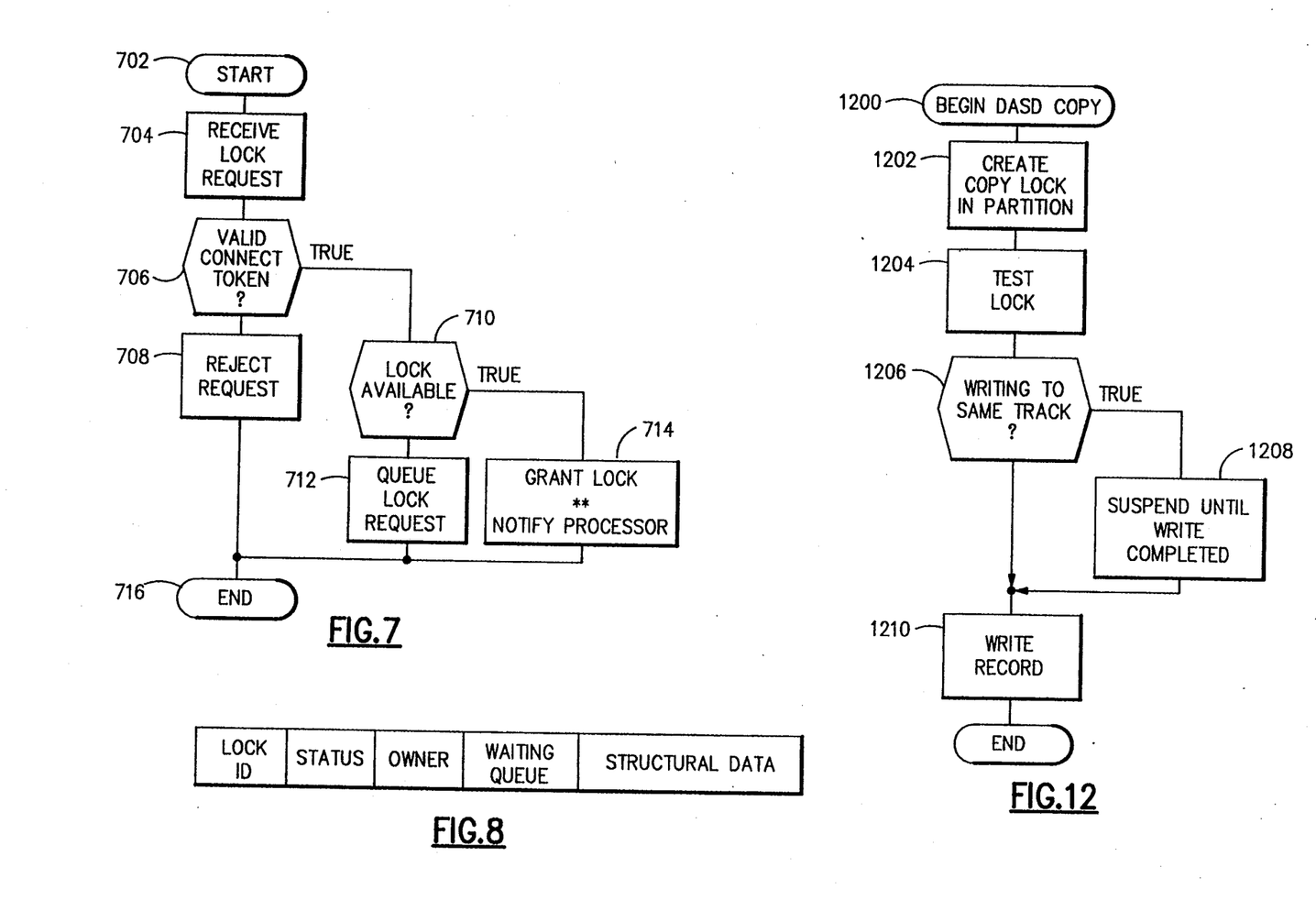
FIG. 7 is a flowchart describing the control unit lock granting process according to the present invention.
FIG. 8 is a block layout of the data captured by the lock process.
FIG. 12 is a flowchart illustrating the DASD copy process according to the present invention.

The operation of the locking facility is described with reference to FIG. 7. The control unit lock box 409 receives a lock request 704. The request is validated including testing the Connect Token 706. Invalid requests, including requests with a revoked connect token, are rejected 708 and processing stops 716. The lock box next determines 710 whether the requested lock is available based on the Lock ID passed with the request. If so, the lock request is granted 714, the processor notified, a lock is dynamically created, and the lock information shown in FIG. 8 is captured. The format of the lock information is not critical and can vary widely depending on particular implementation details. The Lock ID field is used to test for lock conflicts and the Waiting Queue to hold information regarding processes waiting for release of the lock.

If the lock is not available due to another processor holding a lock on the requested lock ID, the lock request is enqueued 712. The preferred embodiment maintains at most one queued lock request per lock id for each connected user.

Figure 9:
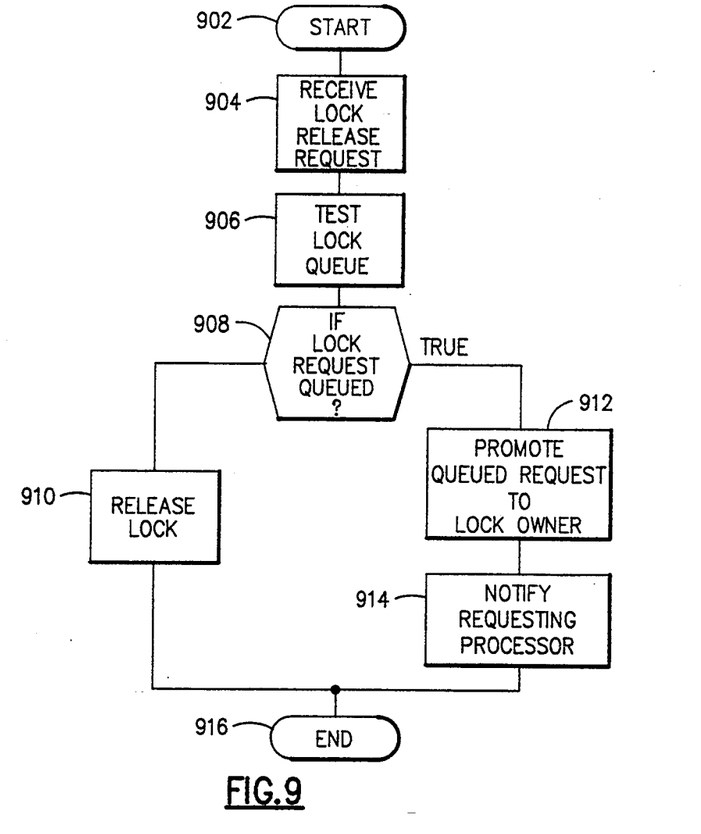
FIG. 9 is a flowchart illustrating the process of lock release according to the present invention.

Release of a lock is described with reference to FIG. 9. When a lock is released 904, the lock box checks the queued lock requests 906. If a request is queued for that lock ID 908, it is dequeued 912, lock information is captured, and lock notification sent to the requesting processor 914. If there no queued request the lock is fully released 910.

FENCING PROCESS

The preferred embodiment of the present invention employs a process to fence unresponsive and erratic processors. The lock facility uses a logical connection between the processor and the lock facility instead of simple physical connections used in prior art systems. Physical connections assume all commands issued through that connection are valid. A logical connection tests each command to ensure that the issuer is properly identified before acting on any commands. Only currently connected processors may use the command functions.

Figure 10:
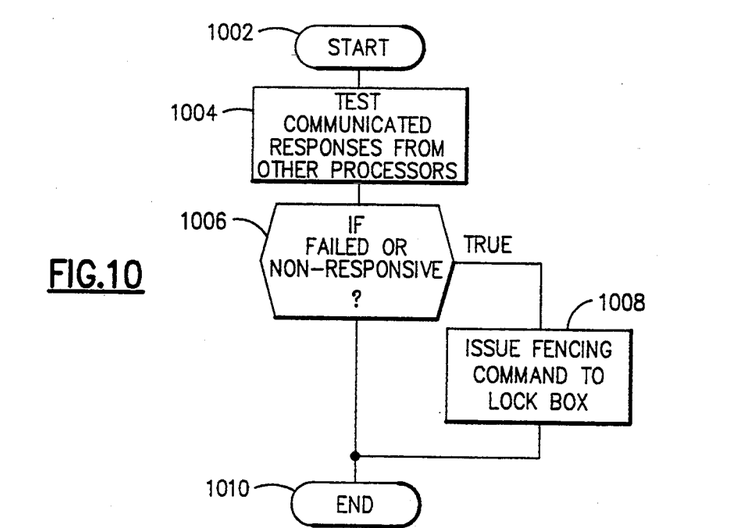
FIG. 10 is a flowchart illustrating the process of fencing according to the present invention.

The preferred embodiment allows any processor to terminate any other processor that is non-responsive or determined to be "erratic." The preferred embodiment tests for processors that are unresponsive to communication requests and responds to operator commands. Other methods of detecting erratic operation such as "heartbeat" monitoring also could be employed. The revocation of lock access can signal a processor that is has been removed from the shared DASD complex. The fencing process proceeds as follows (see FIG. 10):

1. A processor tests 1004 communications from other processors for signs that the processor has become erratic. If erratic behavior is detected 1006, the detecting processor notifies the lock box 1008 who then revokes connection access permission from the allegedly erratic processor. The next time the erratic processor issues a lock request it will receive an abnormal return code, and, if still operating with some integrity, will abnormally terminate operations and shut down.
2. The failure of a processor to respond to a critical system message creates a doubt as to the state of the processor. Utilities that depend on multilateral agreement, such as the Move Lock facility described below, cannot operate if all processors do not respond. If that occurs the facility could reach a state where it could not proceed and could not return to a previous state. The system must accurately know the state of its components. Fencing of processors allows the complex to know with certainty that all components of the system are either at a given state or have been fenced out of the complex, This allows the system to continue to process even if one of its component processors abends or fails to respond to communications.

MASTER/SLAVE CONTROL POINT PROCESSING

The control point process of the present invention provides a simple way to implement a master/slave relationship in a loosely coupled system. This process is described with reference to FIG. 11.

Figure 11:
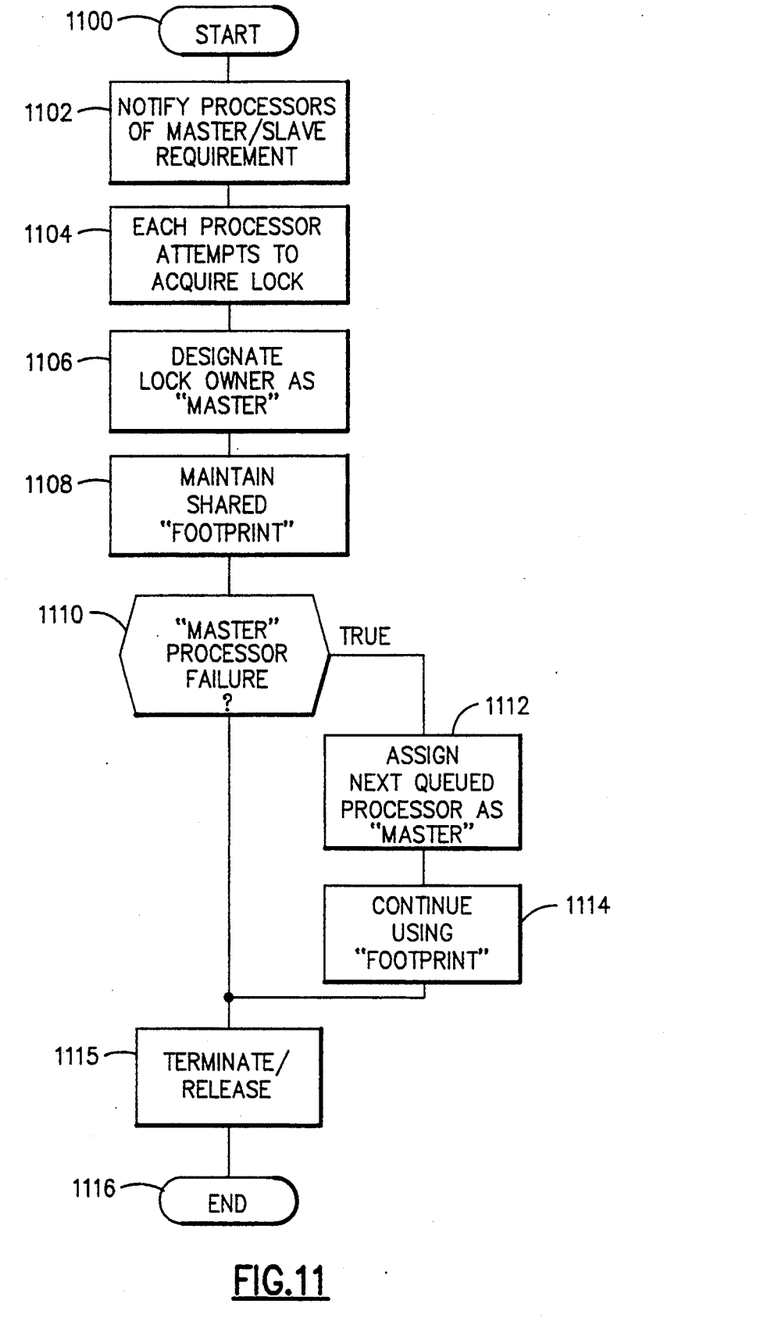
FIG. 11 is a flowchart illustrating the control point process according to the present invention.

A function requiring establishment of a master/slave relationship establishes a special token ID that is used as a special lock name in the DASD locking mechanism. The process operates as follows:

1. A processing event triggers the requirement for the master/slave function and notifies all active processors 1102.
2. Each processor detecting the trigger attempts to acquire the special lock 1104.
3. The processor that actually acquires the lock is designated as the master processor and the requests from the other processors are queued in the lock queue 1106.
4. The master processor controls the specified function on all processors writing a "footprint record" in shared DASD that is accessible to each of the processors 1108.
5. Upon failure of the master processor 1110, the processor recovery code causes the special lock to be released.
6. The lock queue is queried and the next processor in the queue is designated as the master processor 1112. The processing continues based on the footprint record 1114.
b 7. The failing master can recover and attempt to rejoin the complex. It must then attempt to reacquire the special lock, if the function is still in progress, will be queued. If the function has completed and the processor is able to acquire the lock, it will check the footprint record and find that the function has terminated.
8. The master processor releases the control point lock when the function has completed 1115.
9. Each queued processor is given the lock in turn following release by the master processor. Each checks the footprint record and finding the process terminated, releases the control point lock.

The master slave control point process of the present invention has the advantage of not requiring direct communication between the processors to establish or maintain the master/slave relationship. It has the further advantage of providing automatic fallback if the current master processor fails.

PROCESS FOR COPYING ACTIVE DASD

The present invention provides a novel means of controlling data transfer between DASD units while both units are on-line. Copying of a DASD unit while operating is discussed with reference to FIG. 12. The present invention uses the partitioning capabilities of the lock box 409 to improve copy efficiency by reducing lock checking overhead. The DASD copy utility maintains a special lock on the "From DASD" identifying the cylinder and track currently in use. This special lock is maintained in an identifiable lock partition so that other locks need not be scanned to find the special copy lock 1202. This provides a notable improvement over current techniques.

The copying process reads data from the "From DASD" and writes it to the "To DASD". The process of the preferred embodiment causes the processor to read the special lock in a command prefixed to the "From DASD" write 1204. The use of a special lock partition means that this read can occur without inefficient scanning of all lock records. The processor then has the contents of the special lock immediately available for reference in determining where the next record must be written. As in the prior art systems, a record written to a location already processed by the copy utility must be written to the "To DASD" as well as to the "From DASD."

An alternative embodiment relocates the special lock written in step 1202 to the "To DASD" lock box. This special lock contains the identification of the track currently being written. A processor writing to the "To DASD" must prefix the write with commands to test the status of the special lock 1204. If the write request is to the same track currently being processed the request is queued and the processor notified 1208. When the copy utility moves on to the next track, it releases the special lock which can then be acquired by the writing processor. The lock facility promotes the lock on the write request and notifies the processor that initially attempted the write. The processor then must redrive the write request starting with the command after the lock test request.

If the record being written is not on the same track that the copy utility is currently copying then there is no conflict and the write continues normally 1210. There is no need to read the lock table; the only requirement is to attempt to hold a lock on the track to be written. This approach saves both processing time and input/output time. The processor performance is improved because it does not have to actually read the special lock while input/output performance is improved because testing of the lock is faster than reading the lock and causes less data transfer.

LOCK SPACE RECOVERY PROCESS

Figure 13:
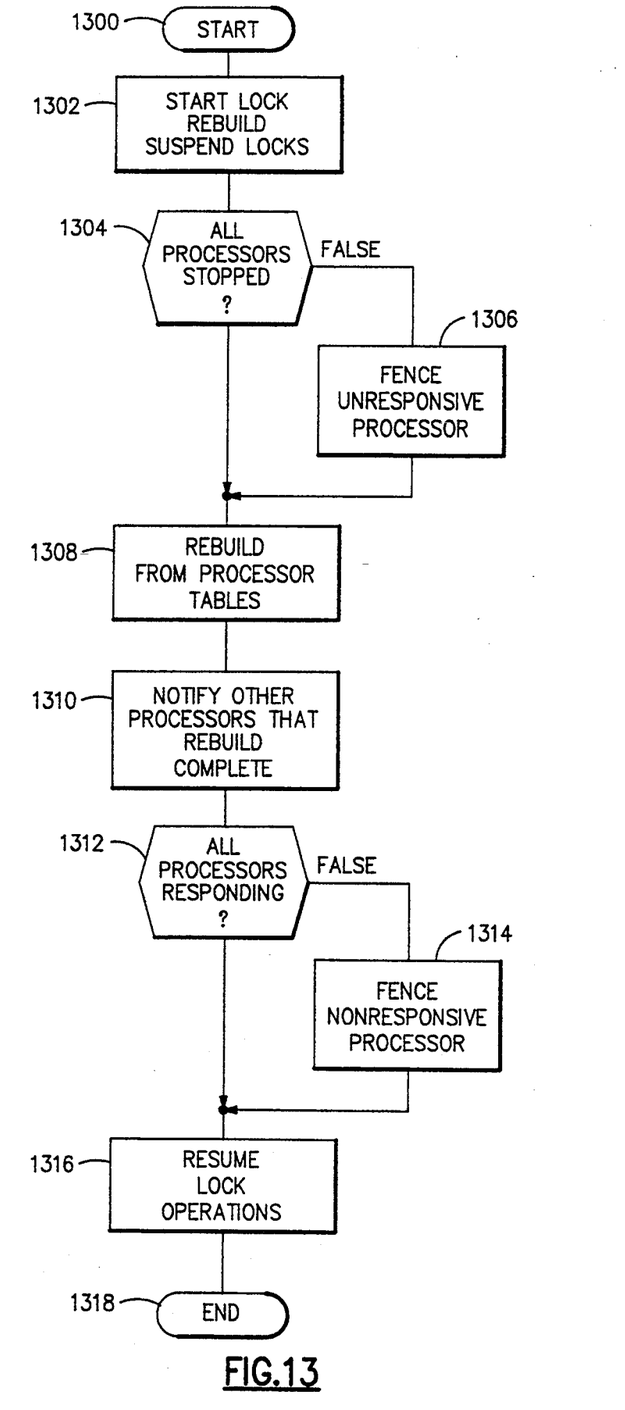
FIG. 13 is a flowchart illustrating the process of rebuilding locks according to the present invention.

Lock space recovery is required whenever lock information is lost and the lock space must be reinitialized, or when lock information is lost on a failing control unit and must be recreated on another control unit. Recovery of the lock space on a reinitialized control unit is accomplished by communicating with the active processors in the complex and then rebuilding the locks. The process has the following steps (see FIG. 13):

1. The lock space rebuild function is started on all active processors in the complex 1300.
2. The rebuild causes all processors to stop lock operations to any DASD in the control unit under recovery 1302.
3. The system waits until all processors have suspended locks for all DASD on the recovering control unit 1304 and then issues a global request to the control unit to clean up any remaining lock information. This is synchronized among the processors and any non-responsive processor is fenced off from the DASD control unit 1306.
4. All processors rebuild the lock space by issuing a new set of "Connect Requests" to the lock space and by locking all previously granted locks using information from their memory tables 1308. This causes an image of all granted locks to be build in the control unit's lock space.
5. Each processor sends a notification to all other processors that the rebuild process is complete 1310. No further processing is done until all processors have responded. If a missing processors do not respond within a set time period (120 seconds in the preferred embodiment) they are fenced 1512 and the function continues without them.
6. Once all processors have responded, they are informed that they can restart lock operations by redriving any previously queued requests to rebuild the lock image of waiting lock requesters, Normal locking can then proceed after the queued lock requests have been rewritten 1314.

MOVE LOCK PROCESS

Figure 14:
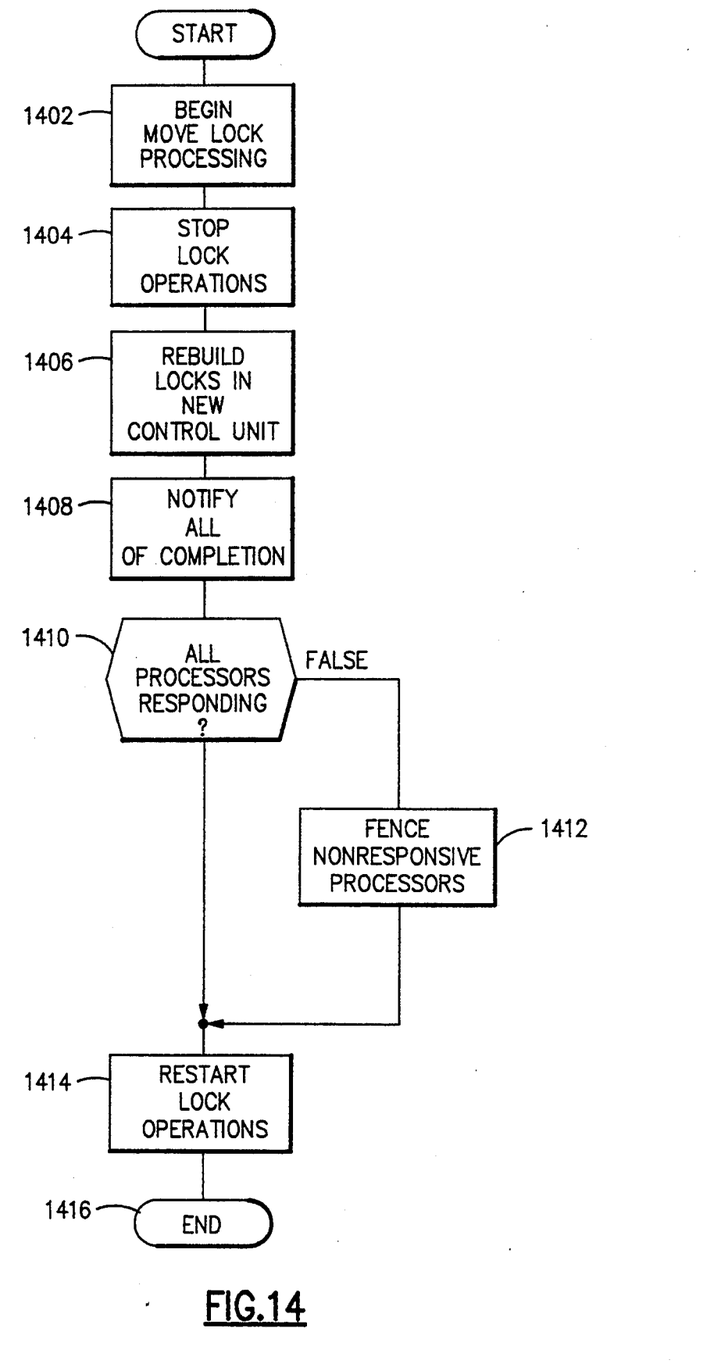
FIG. 14 is a flowchart illustrating the process of moving locks according to the present invention.

The Move Lock function rebuilds the granted and queued locks in a new DASD lock space from information in each active processor's memory tables. The following process steps are performed (see FIG. 14):

1. A Move Lock function is started in all processors in the complex 1402.
2. All processors stop lock operations to the old DASD 1404.
3. All processors rebuild the lock space by locking all previously granted locks using information from their memory tables 1406. This causes an image of all granted locks to be build in the control unit's lock space.
4. Each processor informs all other processors when it has completed the rebuilding of its lock entries 1408. Processing cannot continue until all processors have responded or non-responsive processors are deactivated. Missing processors (over 120 seconds) are fenced and the function continues without them 1410.
5. Once all processors have responded, they are informed that they can restart lock operations by redriving any previously queued requests to rebuild the lock image of waiting lock requesters 1412.

The new process for rebuilding and moving locks improves reliability and availability because the complex need not be taken down if one processor is unable to respond within the set time. Fencing now protects the system from that processor.

The present invention employs processes that operate asynchronously. This allows use of geographically distributed control units connected by, for example, fiber optic connectors. This ability to geographically distribute the DASD control units means that the process of the present invention can be used for disaster recovery of DASD information. These inventive techniques can be used to bring up a backup system upon catastrophic failure of the main processing complex.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

We claim:

1. A method of granting exclusive control to one of a plurality of processors sharing a data storage device to establish a master/slave relationship between said processors, whereby one of said processors is established as a master processor and the remainder of said processors are established as slaves to said master processor, said method comprising the steps of:

establishing a lock token in said shared storage device;

notifying each of said processors that a designation of exclusive control is required;

in response to said notification, issuing from each of said processors a request to acquire exclusive control of said lock token; and granting exclusive control to the first of said processors to request said lock token by establishing said processor as a master processor and establishing the remainder of said plurality of processors as slaves to said master processor.

2. The method of claim 1, further comprising the step of enqueuing the requests of the remainder of said plurality of processors.

3. The method of claim 2, further comprising the step of dequeuing the request of a next one of said processors and granting exclusive control to said processor if the processor holding said lock token releases control of said lock token.

4. The method of claim 1 wherein the processor holding said lock token releases said lock token upon task completion.

5. The method of claim 1 wherein the processor holding said lock token releases said lock token upon processor failure.

6. A method for reconstructing lock table entries for a shared data storage device after loss of said lock table entries, said entries representing lock requests from a plurality of processors that share access to said data storage device, the method comprising the steps of:

notifying each of said processors of the need to recreate said lock table entries and requesting that said processors stop lock operations on said data storage device;

verifying acknowledgement by each of said processors that they have stopped using locks;

requesting from each of said processors data on locks held by said processors;

rebuilding said lock table entries based upon the returns from said processors; and issuing a resume normal processing message to each of said plurality of processors when said lock table has been rebuilt.

7. The method of claim 6, further comprising the steps of:

determining whether a processor has failed to respond to said notification request; and fencing said non-responding processor to prevent further data updates from said processor.

8. In a system having a plurality of processors coupled to a shared data storage facility, a method for controlling access to said shared data storage facility by said processors, said method comprising the steps of:

assigning each of said processors a connection token indicating a logical connection between the processor and the shared data storage facility;

invalidating the connection token of any of said processors sensed to be operating abnormally;

establishing a lock for controlling access to said shared data storage facility;

in response to a request from one of said processors to acquire said lock, determining whether the request is accompanied by a valid connection token; and denying said request to acquire said lock if it is accompanied by an invalid connection token.

9. The method of claim 8 further comprising the steps of:

testing said lock to determine whether it is held by another one of said processors;

if said lock is not held by another one of said processors, granting said lock to the processor requesting said lock; and if said lock is held by another one of said processors, placing said request in a queue for requests to acquire said lock.

10. The method of claim 8, further comprising the step of returning an error condition to the requesting processor if the request is accompanied by an invalid connection token.

11. The method of claim 10 wherein the requesting processor halts operation upon the return of said error condition.

12. The method of claim 8, further comprising the steps of:

sending a message to one of said processors requesting a response from said processor;

waiting a predetermined time for a response from said processor; and assigning an abnormal status condition to said processor if said response is not received within said predetermined time.

13. The method of claim 12 wherein said message is sent from one of said processors to another of said processors, said one processor notifying said invalidating means of said abnormal condition of said other processor.

14. A method for copying data from a first shared data storage volume to a second shared data storage volume while both volumes are accessible by a plurality of processors, said method comprising the steps of:

establishing a copy lock in a lock space associated with said first volume, said copy lock indicating the portion of said first volume currently being accessed, said copy lock being located in a defined portion of said lock space so as to be accessible without having to access other locks in said space;

copying said data by reading data from successive portions of said first volume and writing said data to corresponding portions of said second volume;

updating said copy lock to identify the portion of said first volume currently being copied to said second volume;

in response to a request to write data to a requested portion of said first volume, accessing said copy lock in said defined portion of said lock space to determine the relation between the requested portion and the portion currently being copied;

if said request references a portion already copied to said second data volume, duplicating said request with respect to said second volume; and if said request references the portion of said first volume currently being copied, delaying processing of said request until said portion has been completely copied to said second volume.

15. The method of claim 14 wherein said portion of said first and second volumes is a track.

16. The method of claim 14 wherein said copy lock is accessed without accessing other locks in said space.

17. The method of claim 14 wherein said copy lock is accessed by the requesting processor when it makes said request.

18. A method for copying data from a first shared data storage volume to a second shared data storage volume while both volumes are accessible by a plurality of processors, said method comprising the steps of:
 establishing a copy lock in a lock space associated with said second volume, said copy lock indicating the portion of said second volume currently being accessed;
 copying said data by reading data from successive portions of said first volume and writing said data to the corresponding portions of said second volume;
 updating said copy lock to identify the portion of said second volume currently being copied from said first volume;
 in response to a request to write data to a requested portion of said second volume, accessing said copy lock to determine the relation between the requested portion and the portion currently being copied;
 if said request references a portion already copied to said second data volume, granting said request with respect to said second volume; and
 if said request references the portion of said second volume currently being copied, delaying processing of said request until said portion has been completely copied from said first volume.

19. The method of claim 18 wherein said copy lock is located in a defined portion of said lock space so as be accessible without having to access other locks in said space.

20. Apparatus for granting exclusive control to one of a plurality of processors sharing a data storage device to establish a master/slave relationship between said processors, whereby one of said processors is established as a master processor and the remainder of said processors are established as slaves to said master processor, said apparatus comprising:
 means for establishing a lock token in said shared storage device;
 means for notifying each of said processors that a designation of exclusive control is required;
 means responsive to said notification for issuing from each of said processors a request to acquire exclusive control of said lock token; and
 means for granting exclusive control to the first of said processors to request said lock token by establishing said processor as a master processor and establishing the remainder of said plurality of processors as slaves to said master processor.

21. Apparatus for reconstructing lock table entries for a shared data storage device after loss of said lock table entries, said entries representing lock requests from a plurality of processors that share access to said data storage device, said apparatus comprising:
 means for notifying each of said processors of the need to recreate said lock table entries and requesting that said processors stop lock operations on said data storage device;
 means for verifying acknowledgement by each of said processors that they have stopped using locks;
 means for requesting from each of said processors data on locks held by said processors;
 means for rebuilding said lock table entries based upon the returns from said processors; and
 means for issuing a resume normal processing message to each of said plurality of processors when said lock table has been rebuilt.

22. In a system having a plurality of processors coupled to a shared data storage facility, apparatus for controlling access to said shared data storage facility by said processors, said apparatus comprising:
 means for assigning each of said processors a connection token indicating a logical connection between the processor and the shared data storage facility;
 means for invalidating the connection token of any of said processors sensed to be operating abnormally;
 means for establishing a lock for controlling access to said shared data storage facility;
 means responsive to a request from one of said processors to acquire said lock for determining whether the request is accompanied by a valid connection token; and
 means for denying said request to acquire said lock if it is accompanied by an invalid connection token.

23. Apparatus for copying data from a first shared data storage volume to a second shared data storage volume while both volumes are accessible by a plurality of processors, said apparatus comprising:
 means for establishing a copy lock in a lock space associated with said first volume, said copy lock indicating the portion of said first volume currently being accessed, said copy lock being located in a defined portion of said lock space so as to be accessible without having to access other locks in said space;
 means for copying said data by reading data from successive portions of said first volume and writing said data to corresponding portions of said second volume;
 means for updating said copy lock to identify the portion of said first volume currently being copied to said second volume;
 means responsive to a request to write data to a requested portion of said first volume for accessing said copy lock in said defined portion of said lock space to determine the relation between the requested portion and the portion currently being copied;
 means responsive to a request referencing a portion already copied to said second data volume for duplicating said request with respect to said second volume; and
 means responsive to a request referencing the portion of said first volume currently being copied for delaying processing of said request until said portion has been completely copied to said second volume.

24. Apparatus for copying data from a first shared data storage volume to a second shared data storage volume while both volumes are accessible by a plurality of processors, said apparatus comprising:
 means for establishing a copy lock in a lock space associated with said second volume, said copy lock indicating the portion of said second volume currently being accessed;
 means for copying said data by reading data from successive portions of said first volume and writing said data to the corresponding portions of said second volume;

means for updating said copy lock to identify the portion of said second volume currently being copied from said first volume;

means responsive to a request to write data to a requested portion of said second volume for accessing said copy lock to determine the relation between the requested portion and the portion currently being copied;

means responsive to a request referencing a portion already copied to said second data volume for granting said request with respect to said second volume; and means responsive to a request referencing the portion of said second volume currently being copied for delaying processing of said request until said portion has been completely copied from said first volume.

* * * * *